(12) United States Patent
Bode et al.

(10) Patent No.: US 6,746,308 B1
(45) Date of Patent: Jun. 8, 2004

(54) DYNAMIC LOT ALLOCATION BASED UPON WAFER STATE CHARACTERISTICS, AND SYSTEM FOR ACCOMPLISHING SAME

(75) Inventors: Christopher A. Bode, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 240 days.

(21) Appl. No.: 09/903,267

(22) Filed: Jul. 11, 2001

(51) Int. Cl.[7] .................. B24B 49/00; B24B 51/00; B24B 1/00
(52) U.S. Cl. .................. 451/8; 451/41; 451/54; 451/57; 451/59; 451/63
(58) Field of Search .................. 451/8, 41, 59, 451/57, 58, 65–71, 63, 54; 216/88, 89, 90; 438/691, 692, 693

(56) References Cited

U.S. PATENT DOCUMENTS

| | | | | |
|---|---|---|---|---|
| 6,062,954 A | * | 5/2000 | Izumi | 451/72 |
| 6,213,847 B1 | * | 4/2001 | Torii | 451/8 |
| 6,309,279 B1 | * | 10/2001 | Bowman et al. | 451/41 |
| 6,338,668 B1 | * | 1/2002 | Lin et al. | 451/9 |
| 6,354,922 B1 | * | 3/2002 | Sakurai et al. | 451/67 |
| 6,431,964 B1 | * | 8/2002 | Ishikawa et al. | 451/65 |
| 6,517,412 B2 | * | 2/2003 | Lee et al. | 451/5 |
| 6,524,163 B1 | * | 2/2003 | Stirton | 451/5 |
| 6,565,416 B2 | * | 5/2003 | Dunton et al. | 451/6 |

* cited by examiner

Primary Examiner—Timothy V. Eley
(74) Attorney, Agent, or Firm—Williams, Morgan & Amerson, P.C.

(57) ABSTRACT

In one illustrative embodiment, the method comprises providing a plurality of wafer lots, each of the lots comprising a plurality of wafers, performing at least one process operation on at least some of the wafers in each of the plurality of lots, identifying processed wafers having similar characteristics, re-allocating the wafers to lots based upon the identified characteristics, and performing additional processing operations on the identified wafers having similar characteristics in the re-allocated lots. In one illustrative embodiment, the system comprises a first processing tool for performing processing operations on each of a plurality of wafers in each of a plurality of wafer lots, a controller for identifying processed wafers having similar characteristics and re-allocating the wafers to lots based upon the identified characteristics, and a second processing tool adapted to perform additional processing operations on the identified wafers having similar characteristics in the re-allocated lot.

10 Claims, 2 Drawing Sheets

DYNAMIC LOT ALLOCATION BASED UPON WAFER STATE CHARACTERISTICS, AND SYSTEM FOR ACCOMPLISHING SAME

BACKGROUND OF THE INVENTION

1. Field of the Invention

The present invention is generally directed to the field of semiconductor manufacturing, and, more particularly, to dynamic lot allocation based upon wafer state characteristics, and a system for accomplishing same.

2. Description of the Related Art

Modern integrated circuit devices are comprised of millions of devices, e.g., transistors, formed above a semiconductor wafer comprised of, for example, silicon. Typically, integrated circuit devices are formed above a substrate in the shape of a flat, cylindrical wafer. Current semiconductor manufacturing operations use 8-inch diameter wafers. However, it is anticipated that 12-inch diameter wafers will be used in the immediate future. Additional increases in wafer size may also occur in the more distant future.

In general, the process of forming integrated circuits involves the formation of layers or films of material, selective removal of portions of those layers, introducing dopant atoms into the substrate at predefined locations, and formation of a plurality of conductive interconnections that will allow the devices to electrically communicate with one another and perform their intended function. The processes involved include, for example, deposition processes, etching processes, ion implantation processes, photolithography processes, thermal growth processes and various heat treating processes. The processes may be performed in a variety of process flows or sequences to form completed integrated circuit devices. Given the very small feature sizes on modern integrated circuit devices, e.g., 0.18 $\mu$m and less, great care is taken in performing each and every processing step, e.g., deposition, etch, polish, etc., in an effort to achieve the precision required to form the small features on modern integrated circuit devices.

Nevertheless, despite efforts to the contrary, processed wafers may exhibit variations in one or more characteristics or states. For example, with reference to FIG. 1, when a process layer 12, e.g., silicon dioxide, is formed above a wafer 10 and thereafter subjected to a chemical mechanical polishing process, a surface 14 of the process layer 12 may be domed as a result of a so-called edge-fast (or center-slow) polishing process (the view depicted in FIG. 1 is exaggerated for purposes of explanation). Alternatively, although not depicted in FIG. 1, the surface 14 of the process layer 12 may be dished as a result of a center-fast (or edge-slow) polishing process. By way of another example, as depicted in FIG. 2, due to a variety of factors, gate electrodes 16 formed above different regions of a wafer 10 may exhibit significantly different critical dimensions 15. For example, as depicted in FIG. 2, the gate electrodes 16 near an edge region 18 have a larger critical dimension 15 as compared to the critical dimension 15 of gate electrodes 16 near a center region 20 of the wafer 10. As another example, in photolithography operations, a layer of photoresist may be formed such that the thickness of the layer of photoresist is greater at the edge of the wafer 10 as compared to the center of the wafer 10.

All of these variations can have an adverse impact on subsequent processing, device yields and overall manufacturing efficiencies. For example, if a process layer is formed too thick in a given region, this over-thickness may determine the minimum required etch time for the entire layer, as complete removal of the etched portions of the process layer must be assured. As a result, the additional etch time required to etch through the additional thickness of the process layer may damage the underlying process layers, and/or cause difficulty in maintaining feature size accuracy in other areas of the process layer. As another example, forming a layer of photoresist above a process layer that has a domed or dished surface profile may result in the layer of photoresist having areas of differing thickness. As a result, subsequent exposure processes performed in a stepper tool may be adversely impacted. For example, given the variation in photoresist thickness, there may be unacceptable deviations in the critical dimension of photoresist features formed in areas of the layer of photoresist having different thicknesses.

Efforts have been made to adjust various process parameters based upon wafer characteristic variations. For example, as shown in FIG. 1, if it is determined that, as a result of a polishing process, a process layer 12 has a domed surface 14, a subsequent layer 17 (indicated by dashed lines) formed above the domed layer 12 may be formed using a deposition process that is designed or modified to deposit more material on the edge region 18 of the wafer 10 than in the center region 20 of the wafer 10. Other modifications may be made to other processes in an effort to compensate for such variations in wafer characteristics. However, all of these methodologies generally involve varying one or more parameters of a processing operation on a lot-by-lot or wafer-by-wafer basis. Such methodologies may, in some cases, require extensive capital, material and labor to implement, and they may not be necessary or appropriate for some semiconductor manufacturing operations.

The present invention is directed to a method that may solve, or at least reduce, some or all of the aforementioned problems.

SUMMARY OF THE INVENTION

In one illustrative embodiment, the method comprises providing a plurality of wafer lots, each of the lots comprising a plurality of wafers, performing at least one process operation on at least some of the wafers in each of the plurality of lots, identifying processed wafers having similar characteristics, re-allocating the wafers to lots based upon the identified characteristics, and performing additional processing operations on the identified wafers having similar characteristics in the re-allocated lots. In a further embodiment, the method involves identifying wafers having similar across-wafer characteristics and re-allocating the lots of wafers on that basis.

In another illustrative embodiment, the present invention is directed to a system comprised of a first processing tool for performing processing operations on each of a plurality of wafers in each of a plurality of wafer lots, a controller for identifying processed wafers having similar characteristics and re-allocating the wafers to lots based upon the identified characteristics, and a second processing tool adapted to perform additional processing operations on the identified wafers having similar characteristics in the re-allocated lot.

BRIEF DESCRIPTION OF THE DRAWINGS

The invention may be understood by reference to the following description taken in conjunction with the accompanying drawings, in which like reference numerals identify like elements, and in which.

Figure 1:
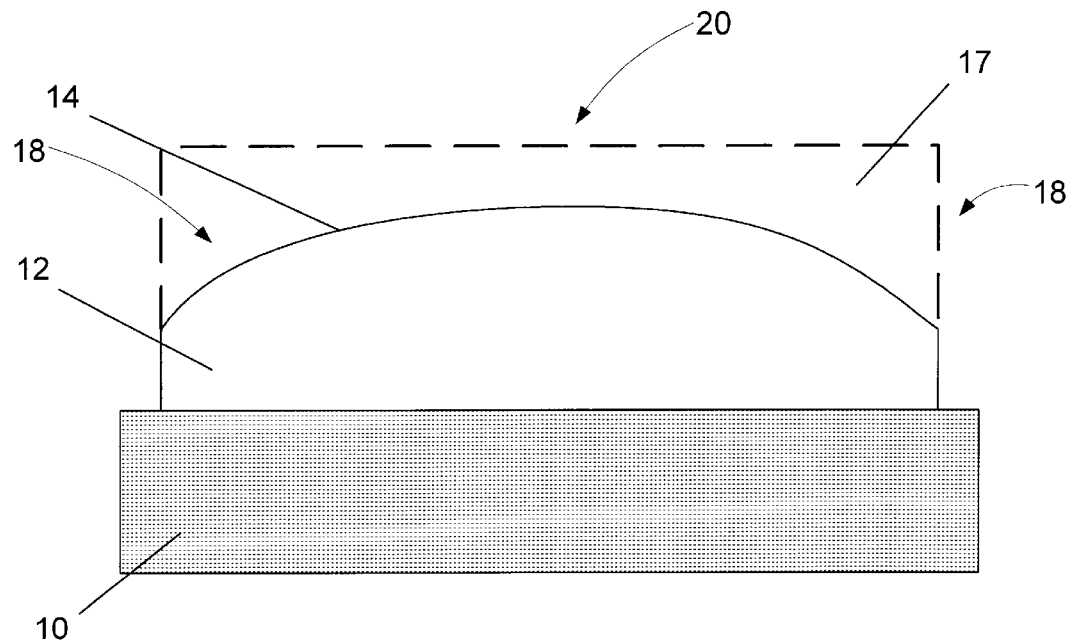
FIG. 1 is cross-sectional view of an illustrative process layer that was subjected to a chemical mechanical polishing operation.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to dynamic lot allocation based upon wafer state characteristics, and a system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc. Moreover, the present invention is applicable to polishing process layers comprised of a variety of different materials.

As described in the background section of this application, various processing operations performed in the manufacture of integrated circuit devices may result in wafers having various states or characteristics. For example, a surface of a process layer may have a domed or dished configuration as a result of a chemical mechanical polishing operation or as a result of a deposition process that forms different amounts of material in different regions or areas of a wafer. The domed topography of the process layer 12 depicted in FIG. 1 is but one example of various characteristics or states of wafers that may vary from wafer-to-wafer as processing operations are performed.

Figure 2:
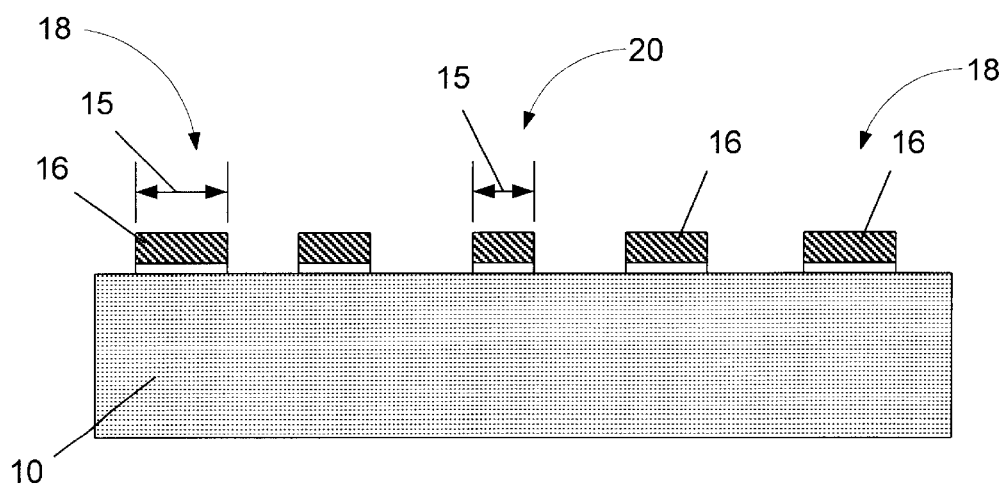
FIG. 2 is a cross-sectional view of a wafer having a plurality of gate electrode structures of differing critical dimensions.

As another example, as shown in FIG. 2, the gate electrodes 16 formed above the wafer 10 may have varying critical dimensions 15. The variations may be due to a variety of factors. For example, the critical dimensions may vary due to variations in the thickness of a layer of photoresist (not shown) used in patterning the gate electrodes 16. That is, due to thickness variations in the layer of photoresist, the critical dimensions 15 of features formed in the layer of photoresist may not be consistent across the wafer 10. Without more, the variations in the critical dimensions of the gate electrodes 16 would result in devices having different, and perhaps unacceptable, electrical performance characteristics, i.e., some of the device will have too low of an operating speed or exhibit off-state leakage currents that are too large. In an effort to compensate for these variations, one or more parameters of one or more of the ion implant processes performed after the gate electrodes 16 are formed to form the source/drain regions for the devices may be varied. That is, if the critical dimensions of the gate electrodes 16 in a given area are too large, the concentration of dopant atoms implanted in that area may be increased. Thus, the ion implantation process parameters would be varied on a wafer-by-wafer or lot-by-lot basis in an effort to compensate for such variations in the critical dimensions of the gate electrodes 16.

In modern semiconductor manufacturing operations, wafers are normally processed on a lot basis. That is, a lot that typically contains 20–25 wafers 10 is transported from process to process as dictated by the particular process flow for the particular devices under construction. This process occurs sequentially from process to process until such time as the integrated circuit device is completed. For example, a lot comprised of 25 wafers may be sent to a deposition tool whereby a process layer is deposited on each of the wafers within the lot using the same process recipe for each wafer 10. After all 25 wafers are processed at the deposition tool, the entire lot of wafers is transported to the next processing station, e.g., an etch tool or a chemical mechanical polishing tool.

Despite performing the same process recipe on each wafer 10 in each lot, lot after lot, the characteristics or states of the wafers tend to vary within a lot, and from lot to lot. There may be many causes of such variations, e.g., the composition of process gases, variations in temperature or pressure, cleanliness of the process tool, the state of consumables used during such processes, e.g., the condition of a polishing pad used in a chemical mechanical polishing process, etc.

In the end, the characteristics, e.g., surface topography or profile, layer thickness, gate electrode profiles, feature critical dimensions, etc., for all of the wafers in a single lot, or all of the wafers processed in several lots, tended to vary to some degree. Nevertheless, the wafers with differing characteristics remained in their original lot and were subjected to additional processing on the assumption that any variations were unimportant. Alternatively, one or more parameters of a subsequent process operation were varied in an attempt to compensate for the variations in wafer characteristics or states on a wafer-by-wafer or lot-by-lot basis.

According to the present invention, wafers 10 having similar characteristics or states are identified, collected and positioned in a lot containing wafers 10 exhibiting similar characteristics. In short, the lots are re-allocated based upon the state or characteristics of the previously processed wafers 10. The wafers selected for re-allocation may be taken from a plurality of different lots subjected to previous processing operations. Moreover, the wafers 10 may be re-allocated at any point during a particular process flow.

Thereafter, the re-allocated lot of wafers 10, containing wafers having similar characteristics, may be subjected to additional processing. Using this technique, subsequent process operations may be performed on all of the wafers in the re-allocated lot. That is, in one embodiment, the process recipe performed on the wafers 10 in the re-allocated lot need not be adjusted or changed for each wafer 10 in the re-allocated lot. In short, in one embodiment, each of the wafers 10 in the re-allocated lot have the same compensatory process performed on the wafer. In this manner, processing operations may be more efficient and yields may be increased. Of course, the process recipe performed on the wafers 10 in the re-allocated lot may be varied if desired or dictated by the requirements of the device under construction.

A variety of characteristics of the wafer may be used to re-allocate the wafers 10. For example, characteristics such as surface topography or profile, layer thickness, feature sizes, optical properties of a process layer and the thermal budget of the wafers may be used in identifying wafers 10 to be re-allocated. For example, for process layers that are subjected to a stepper exposure process, the optical characteristics, e.g., reflectivity, of the process layer are very important. Moreover, these characteristics may vary across the surface of a wafer, e.g., gate electrodes 16 formed in a center region 20 of a wafer 10 may have a critical dimension 15 greater less than a critical dimension 15 of gate electrodes 16 formed on an edge region 18 of a wafer 10, shown in FIG. 2. Depending upon the characteristics under consideration, a variety of metrology tools may be used to assist in characterizing the wafer 10. For example, metrology tools, such as an ellipsometer, a profilometer, and a scanning electron microscope, may be used.

Figure 3:
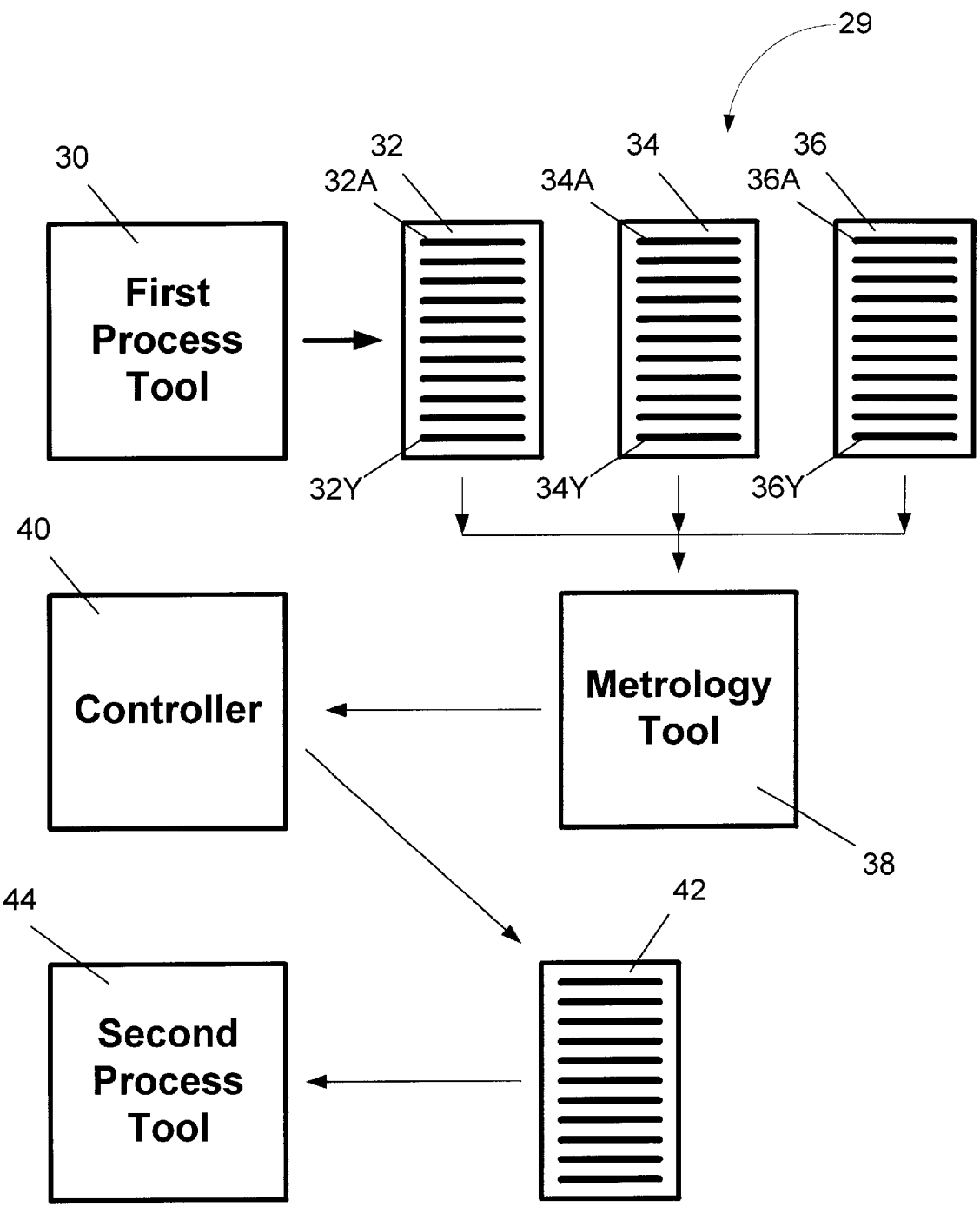
FIG. 3 is a schematic depiction of an illustrative system that may be used with the present invention.

FIG. 3 depicts an illustrative system 29 that may be used with the present invention. As shown therein, the system 29 is comprised of a first processing tool 30, a metrology tool 38, a controller 40 and a second processing tool 44. The first and second processing tools 30, 44 are intended to be representative of any type of processing tool employed in the manufacture of integrated circuit devices, e.g., deposition tools, wet or dry etching tools, chemical mechanical polishing tools, photolithography tools or modules, furnaces, rapid thermal anneal chambers, etc.

FIG. 3 also depicts three illustrative lots 32, 34, 36 containing wafers that have been subjected to a processing operation in the first processing tool 30. Each of the lots 32, 34, 36 contain 25 wafers each, 32A–Y, 34A–Y and 36A–Y, respectively. After processing in the first processing tool 30 is completed, the lots 32, 34, 36 are provided to the metrology tool 38 whereby any of a variety of characteristics of the processed wafers, such as those discussed previously, may be measured or determined. The metrology tool 38 provides this wafer characteristic data to the controller 40. The controller 40 then determines, based upon this data, if and how the various processed wafers should be re-allocated to a different lot. For example, in the depicted embodiment, a re-allocated lot 42 of wafers exhibiting similar characteristics has been identified by the controller 40. The re-allocated lot 42 may contain any number of processed wafers in the lots 32, 34, 36 and any number may be selected from each of the lots 32, 34, 36. Moreover, the re-allocated lot 42 may be subjected to further processing operations at the second processing tool 44.

In the illustrated embodiment, the controller 40 is a computer programmed with software to implement the functions described herein. Moreover, the functions described for the controller 40 may be performed by one or more controllers spread throughout the system. For example, the controller 40 may be a fab level controller that is used to control processing operations throughout all or a portion of a semiconductor manufacturing facility. Alternatively, the controller 40 may be a lower level computer that controls only portions or cells of the manufacturing facility. Moreover, the controller 40 may be a stand-alone device, or it may reside on the metrology tool 38. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 40, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

In one illustrative embodiment, the method comprises providing a plurality of wafer lots, each of the lots comprising a plurality of wafers, performing at least one process operation on at least some of the wafers in each of the plurality of lots, identifying processed wafers having similar characteristics, re-allocating the wafers to lots based upon the identified characteristics, and performing additional processing operations on the identified wafers having similar characteristics in the re-allocated lots. In a further embodiment, the wafer may be identified based upon across-wafer characteristics, i.e., variations in feature size across a wafer. In a more detailed description of the invention, the processing operations performed on the wafers before and/or after the lot re-allocation of the present invention may be comprised of at least one of an etching process operation, a deposition process operation, a chemical mechanical polishing process, an ion implant process operation, and a heating operation.

In another aspect, the present invention is directed to a system that comprises a first processing tool for performing processing operations on each of a plurality of wafers in each of a plurality of wafer lots, a controller for identifying processed wafers having similar characteristics and re-allocating the wafers to lots based upon the identified characteristics, and a second processing tool adapted to perform additional processing operations on the identified wafers having similar characteristics in the re-allocated lot.

In another aspect, the present invention is directed to a system that is comprised of a first processing means for performing processing operations on each of a plurality of wafers in each of a plurality of wafer lots, a controller means for identifying processed wafers having similar characteristics and re-allocating the wafers to lots based upon the identified characteristics, and a second processing means adapted to perform additional processing operations on the identified wafers having similar characteristics in the re-allocated lot. In the disclosed embodiment, the first and second process means may be comprised of at least one of an etch tool, a deposition tool, a chemical mechanical polishing tool, an ion implant tool and a furnace. The controller means disclosed in the specification is the controller 40.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a plurality of wafer lots, each of said lots comprising a plurality of wafers;
   performing at least one process operation on at least some of said wafers in each of said plurality of lots;
   identifying processed wafers having similar characteristics;
   re-allocating said identified wafers having said similar characteristics to lots based upon said identified characteristics; and
   performing additional processing operations on said identified wafers having similar characteristics in said re-allocated lots.

2. The method of claim 1, wherein providing a plurality of wafer lots, each of said lots comprising a plurality of wafers comprises providing a plurality of wafer lots, each of said lots comprising at least twenty wafers.

3. The method of claim 1, wherein said at least one process operation that is performed on at least some of said wafers in each of said plurality of lots is a process operation that is selected from the group consisting of an etching process operation, a deposition process operation, a chemical mechanical polishing operation, an ion implant process operation, and a heating operation.

4. The method of claim 1, wherein said similar characteristics are selected from a group consisting of a surface topography, a feature size, a thickness of a layer of material, an optical characteristic of a process layer formed above said wafer, and a thermal budget of said wafer.

5. The method of claim 1, wherein said additional processing operations performed on said identified wafers having similar characteristics in said re-allocated lots are process operations that are selected from the group consisting of an etching process operation, a deposition process operation, a chemical mechanical deposition operation, an ion implant process operation, and a heating operation.

6. A method, comprising:
   providing a plurality of wafer lots, each of said lots comprising a plurality of wafers;
   performing at least one process operation on at least some of said wafers in each of said plurality of lots;
   identifying processed wafers having similar across-wafer characteristics;
   re-allocating said identified wafers having similar across-wafer characteristics to lots based upon said identified across-wafer characteristics; and
   performing additional processing operations on said identified wafers having similar across-wafer characteristics in said re-allocated lots.

7. The method of claim 6, wherein providing a plurality of wafer lots, each of said lots comprising a plurality of wafers comprises providing a plurality of wafer lots, each of said lots comprising at least twenty wafers.

8. The method of claim 6, wherein said at least one process operation that is performed on at least some of said wafers in each of said plurality of lots is a process operation that is selected from the group consisting of an etching process operation, a deposition process operation, a chemical mechanical polishing operation, an ion implant process operation, and a heating operation.

9. The method of claim 6, wherein said similar across-wafer characteristics are selected from a group consisting of a surface; topography, a feature size, a thickness of a layer of material, an optical characteristic of a process layer formed above said wafer, and a thermal budget of said wafer.

10. The method of claim 6, wherein said additional processing operations performed on said identified wafers having similar across-wafer characteristics in said re-allocated lots are process operations that are selected from the group consisting of an etching process operation, a deposition process operation, a chemical mechanical polishing operation, an ion implant process operation, and a heating operation.

* * * * *